United States Patent
Kao et al.

(10) Patent No.: US 9,006,106 B2
(45) Date of Patent: Apr. 14, 2015

(54) METHOD OF REMOVING A METAL HARDMASK

(71) Applicants: Chia-Ling Kao, San Jose, CA (US); Kwang-soo Kim, San Jose, CA (US); Sean S. Kang, San Ramon, CA (US); Srinivas D. Nemani, Sunnyvale, CA (US)

(72) Inventors: Chia-Ling Kao, San Jose, CA (US); Kwang-soo Kim, San Jose, CA (US); Sean S. Kang, San Ramon, CA (US); Srinivas D. Nemani, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 49 days.

(21) Appl. No.: 13/889,550

(22) Filed: May 8, 2013

(65) Prior Publication Data
US 2014/0273496 A1    Sep. 18, 2014

Related U.S. Application Data

(60) Provisional application No. 61/783,310, filed on Mar. 14, 2013.

(51) Int. Cl.
*H01L 21/311* (2006.01)

(52) U.S. Cl.
CPC .................. *H01L 21/31144* (2013.01)

(58) Field of Classification Search
None
See application file for complete search history.

(56) References Cited

U.S. PATENT DOCUMENTS

| | | | | |
|---|---|---|---|---|
| 5,942,446 | A * | 8/1999 | Chen et al. | 438/734 |
| 6,492,276 | B1 * | 12/2002 | Huang | 438/700 |
| 2003/0044725 | A1 * | 3/2003 | Hsue et al. | 430/314 |
| 2003/0232504 | A1 * | 12/2003 | Eppler et al. | 438/709 |
| 2006/0264033 | A1 * | 11/2006 | Olmen et al. | 438/637 |
| 2009/0017563 | A1 * | 1/2009 | Jiang et al. | 438/4 |
| 2011/0079918 | A1 * | 4/2011 | Zhou et al. | 257/774 |
| 2013/0023122 | A1 * | 1/2013 | Nemani et al. | 438/702 |
| 2013/0023124 | A1 * | 1/2013 | Nemani et al. | 438/703 |
| 2014/0017898 | A1 * | 1/2014 | Nemani et al. | 438/703 |
| 2014/0024220 | A1 * | 1/2014 | Chang et al. | 438/710 |
| 2014/0120726 | A1 * | 5/2014 | Nemani et al. | 438/694 |
| 2014/0213060 | A1 * | 7/2014 | Kao et al. | 438/703 |

* cited by examiner

*Primary Examiner* — Allan Olsen
(74) *Attorney, Agent, or Firm* — Blakely Sokoloff Taylor Zafman LLP

(57) ABSTRACT

Methods of removing metal hardmasks in the presence of ultra low-k dielectric films are described. In an example, a method of patterning a low-k dielectric film includes forming a pattern in a metal nitride hardmask layer formed above a low-k dielectric film formed above a substrate. The method also includes etching, using the metal nitride hardmask layer as a mask, the pattern at least partially into the low-k dielectric film, the etching involving using a plasma etch based on $SiF_x$. The etching also involves forming an $SiO_x$ passivation layer at least on sidewalls of the low-k dielectric film formed during the etching. The method also includes removing the metal nitride hardmask layer by a dry etch process, where the $SiO_x$ passivation layer protects the low-k dielectric film during the removing.

18 Claims, 11 Drawing Sheets

OXIDIZING ASH

~40% in SiCOH with k= 2.5

~10% in SiCOH with k= 2.5

REDUCING ASH

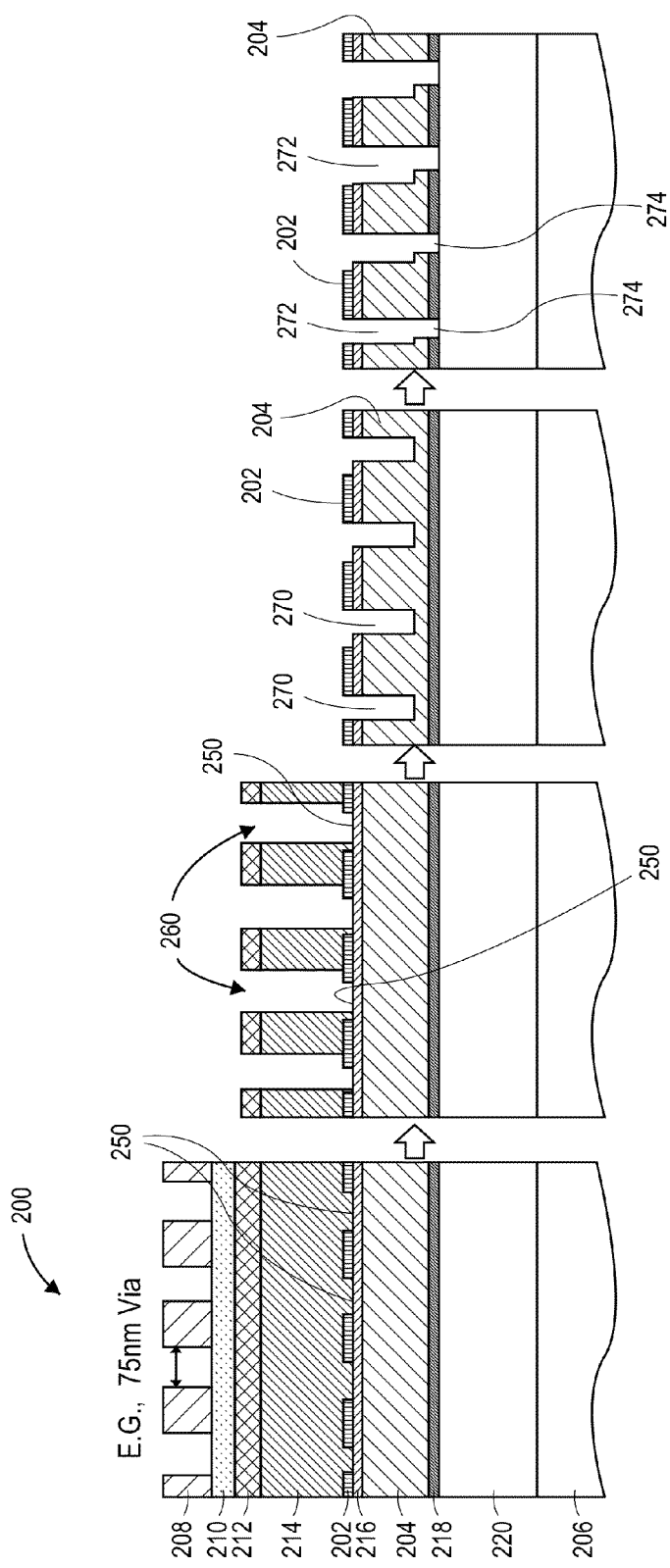

METHOD OF REMOVING A METAL HARDMASK

CROSS-REFERENCE TO RELATED APPLICATIONS

This application claims the benefit of U.S. Provisional Application No. 61/783,310, filed Mar. 14, 2013, the entire contents of which are hereby incorporated by reference herein.

BACKGROUND

1. Field

Embodiments of the present invention pertain to the field of semiconductor processing and, in particular, to methods of removing metal hardmasks in the presence of ultra low-k dielectric films.

2. Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

SUMMARY

One or more embodiments of the present invention are directed to methods of removing metal hardmasks in the presence of ultra low-k dielectric films.

In an embodiment, a method of patterning a low-k dielectric film includes forming a pattern in a metal nitride hardmask layer formed above a low-k dielectric film formed above a substrate. The method also includes etching, using the metal nitride hardmask layer as a mask, the pattern at least partially into the low-k dielectric film, the etching involving using a plasma etch based on $SiF_x$. The etching also involves forming an $SiO_x$ passivation layer at least on sidewalls of the low-k dielectric film formed during the etching. The method also includes removing the metal nitride hardmask layer by a dry etch process, where the $SiO_x$ passivation layer protects the low-k dielectric film during the removing.

In another embodiment, a method of patterning a low-k dielectric film includes forming a pattern in a metal nitride hardmask layer formed above a low-k dielectric film formed above a substrate. The method also includes etching, using the metal nitride hardmask layer as a mask, the pattern at least partially into the low-k dielectric film. The etching involves using a first plasma etch free of $SiF_x$. The method also includes, subsequently, forming, using a second plasma etch based on $SiF_x$, an $SiO_x$ passivation layer at least on sidewalls of the low-k dielectric film formed during the etching. The method also includes removing the metal nitride hardmask layer by a dry etch process, where the $SiO_x$ passivation layer protects the low-k dielectric film during the removing.

BRIEF DESCRIPTION OF THE DRAWINGS

FIGS. 2A-2D illustrate cross-sectional views of various operations in a method of fabricating ultra low-k dielectric self-aligned vias, in accordance with an embodiment of the present invention.

DETAILED DESCRIPTION

Figure 1:
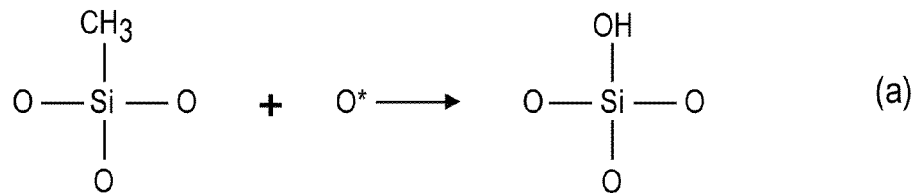
FIG. 1 illustrates mechanisms through which a low-k dielectric layer may be damages or impacted under conventional oxidizing plasma conditions used to remove polymer formed in a conventions fluorocarbon-based etching process.
Figure 1:
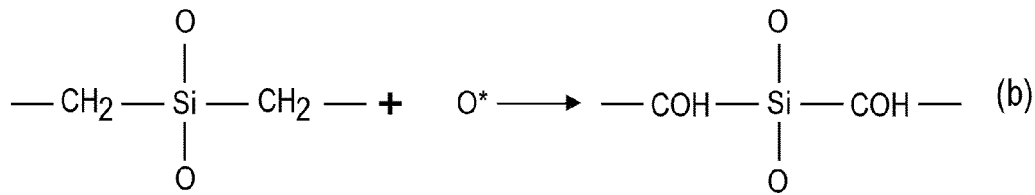
Figure 1:
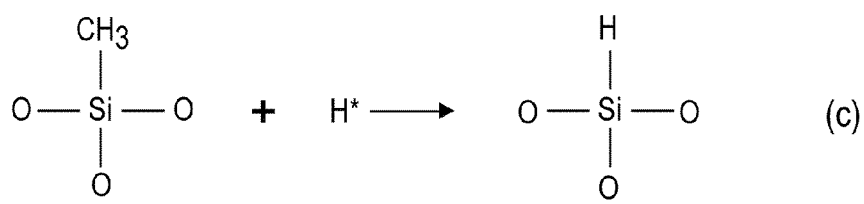
Figure 2E:
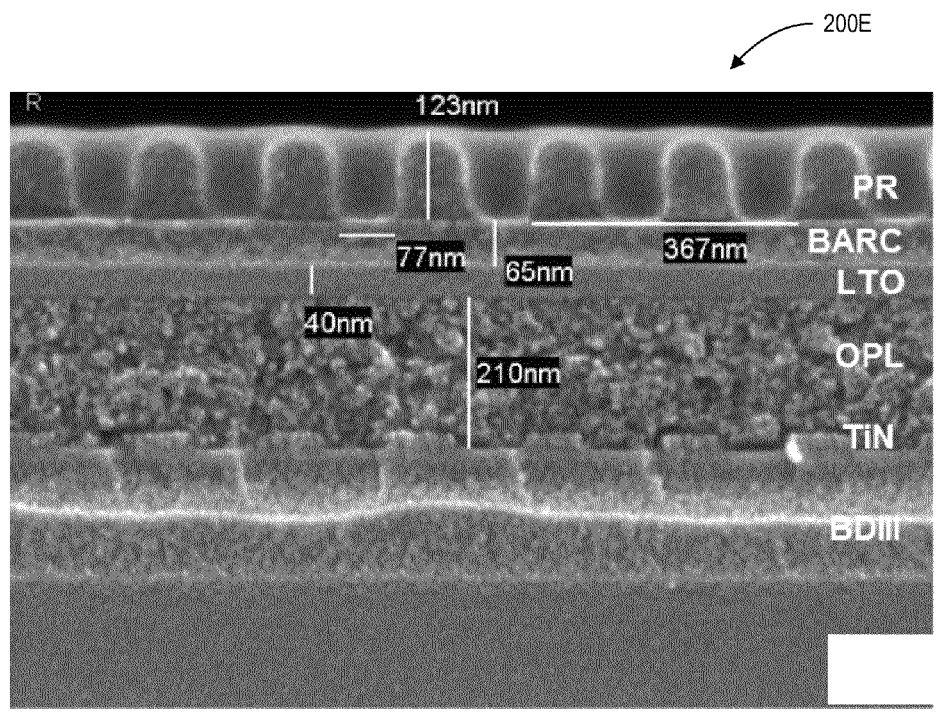
FIG. 2E is a scanning electron microscope (SEM) image of an incoming material stack similar to that of material stack described in association with FIG. 2A, in accordance with an embodiment of the present invention.

Methods of removing metal hardmasks in the presence of ultra low-k dielectric films are described. In the following description, numerous specific details are set forth, such as specific plasma treatments and effects for modifying portions of low-k dielectric films, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

As process dimensions continuous to shrink, a litho-etch, litho-etch (LELE) double exposure patterning for semiconductor device is typically required to print 64 nanometer (nm) pitch metal layers (Mx levels) or below. However, poor overlay can be a significant factor for consideration in successful double patterning applications. For example, without self-aligned via (SAV) processes, the dielectric space between copper lines and vias can become small which can cause reliability issues. Additional embodiments, as described in association with another aspect below, are directed to metal hardmask removal processes, e.g., as performed in the presence of low-k dielectric films.

To address the above noted issues, one or more embodiments described herein is directed to a SAV plasma etch process. In one such embodiment, etch processes described herein can be used for sub 20 nm-node pitch lines and vias in silicon based devices. In one example, a SAV process is employed to build trench-first dual-damascene (DD) dielectric interconnects with a titanium nitride (TiN) mask. The TiN etch selectivity to a low k dielectric film dielectric (such as to Black Diamond III; k=2.55) can be exploited to achieve self-aligned fashion.

More specifically, in a conventional SAV process, $CF_4$, $CHF_3$, $C_xH_yF_z/N_2$ process gases are used. The conventional gas chemistries do not provide sufficiently high selectivity to TiN and, thus, require much thicker TiN hardmask (HM) layers than what is desired. However, the thicker TiN hard mask may not be desirable for subsequent copper (Cu) metal fill in the trench and via. Instead, one or more embodiments are directed to increasing selectivity to TiN, which can enable minimizing the thickness of TiN used. In a specific embodiment, the addition of additional hydrogen ($H_2$) gas in a mixture of carbon tetrafluoride/nitrogen ($CF_4/N_2$) gases can mitigate chemical reaction with a TiN hard mask and improve (reduce) TiN encroachment by increasing the selectivity to TiN. In an embodiment, a series of special tuning nodes is used, including hydrogen flow rate, argon flow rate, chamber pressure, temperature of electrostatic chuck (ESC) and RF bias power, etc. A series of experiments described below demonstrate how to systematically optimize the SAV etch conditions. In one embodiment, one or more SAV etch processes described herein is based on a new gas chemistry combining $CF_4/H_2$ to provide excellent profile and TiN selectivity.

In addition, new approaches and processing sequences for etching low k films damage-free to the low k are described. Traditional dielectric etching is can result in sidewall damage caused by plasma processing and during post etch polymer residue removal. FIG. 1 illustrates mechanisms through which a low-k dielectric layer may be damages or impacted under conventional oxidizing plasma conditions used to remove polymer formed in a conventions fluorocarbon-based etching process. Referring to mechanism (a) of FIG. 1, when undergoing an oxidizing ash, an $SiO_3$-methyl fragment, which makes up approximately 40% of a SiCOH low-k film with a dielectric constant of about 2.5, can undesirably lose its methyl group to a hydroxide group. Referring to mechanism (b) of FIG. 1, when undergoing an oxidizing ash, an $SiO_2$—$(CH_2)_2$ fragment, which makes up approximately 10% of a SiCOH low-k film with a dielectric constant of about 2.5, can undesirably be converted to an $SiO_2$—$(COH)_2$ fragment. Referring to mechanism (c) of FIG. 1, when undergoing a reducing ash, an $SiO_3$-methyl fragment, which makes up approximately 40% of a SiCOH low-k film with a dielectric constant of about 2.5, can undesirably lose its methyl group to a hydride ligand (H).

More generally, new plasma etch development and processes are described for ultra low-K self-aligned via fabrication. In an embodiment, a TiN hard mask is included in the etch process, and high selectivity to the TiN is achieved. In an embodiment, etch processes are performed in a C3 etch chamber. The embodiments described can be used more so as process dimensions continue to shrink, e.g., where additional improvements are required to enable the fabrication of high performance logic devices. As mentioned briefly above, a litho-etch, litho-etch (LELE) double patterning is commonly used to print sub 20 nm-node pitch lines and vias but overlay control is a challenge. A self-aligned via (SAV) process is crucial for LELE-manufactured device performance since, without such an approach, the dielectric space between Cu lines and vias becomes small which can cause reliability issues (e.g., dielectric breakdown and poor TDDB) or even shorts. As illustrated in greater detail below, a trench-first dual-damascene (DD) plasma etch SAV process approach is used to address these issues. In an example involving critical dimensions (CDs) 45 nanometers or less, a TiN hard mask (HM) is used in a material stack and is patterned in a C3 dielectric etcher. Embodiments may be especially useful for back end of line (BEOL) ultra low-k (Ulk) dual damascene (DD) applications. In one embodiment, a SAV process described herein is exhibits excellent profile regardless of the degree of via misalignment in the SAV direction and is free from TiOx by product residues.

In an example, FIGS. 2A-2D illustrate cross-sectional views of various operations in a method of fabricating ultra low-k dielectric self-aligned vias, in accordance with an embodiment of the present invention.

Referring to FIG. 2A an exemplary material stack 200 suitable for dry etch development and/or processing of ultra low-k self-aligned vias in a trench first dual damascene interconnect with TiN hard mask process flow is provided. Specifically, the material film 200 includes an approximately 15 nanometer titanium nitride (TiN) hardmask (HM) 202 and an approximately 180 nanometer ultra-low k material layer 204 (e.g., Black Diamond (BD) III: k=2.55) on 300-mm-diameter silicon wafers 206. Other layers include a patterned photoresist layer 208 (e.g., approximately 140 nanometers), e.g., having approximately 75 nanometers via dimensions patterned therein. Intervening layers such as a bottom anti-reflective coating (BARC) layer 210 (e.g., approximately 77 nanometer), a low temperature oxide layer 212 (e.g., approximately 50 nanometers), and an organic planarization layer (OPL) 214 (e.g., 250 nanometers) can be included between the patterned photoresist layer 208 and the titanium nitride (TiN) hardmask (HM) 202, as depicted in FIG. 2A. Furthermore, an intervening oxide layer 216 (e.g., approximately 20 nanometers) can be included between the titanium nitride (TiN) hardmask (HM) 202 and the ultra-low k material layer 204, while an etch stop layer 218 can be included below the ultra-low k material layer 204, as is also depicted in FIG. 2A. It is to be understood that the specific film stack shown is one of many suitable arrangements for SAV etch processing described herein, and is provided for illustration purposes. It is also to be understood that a complete film stack could also include underlying front of line (FEOL) device layers, such as transistor layers, as well as underlying BEOL metal layers. Furthermore, in the case that a sample is merely a test vehicle for etch process development, basic intervening layers such as an undoped silica glass (USG, e.g., 300 nanometers) layer 220 can be included for simplicity above the underlying substrate 206.

Although a host of material layers is mentioned above and shown in FIG. 2A, some key layers that will typically be involved in a process involving a self-aligned via process flow in the presence of a low-K material can include a metal hard mask layer 202, a photoresist layer 208, and a low-k dielectric layer 204. In one such embodiment, the metal hard mask layer 202 is a metal-containing layer such as, but not limited to, a layer of titanium nitride or a layer of tantalum nitride. The metal hard mask layer 202 is patterned with a plurality of openings 250, as shown in FIG. 2A.

The photoresist layer 208 can be composed of a material suitable for use in a lithographic process. That is, in an embodiment, the photoresist layer is exposed to a light source and subsequently developed. In one embodiment, the portions of the photoresist layer to be exposed to the light source will be removed upon developing the photoresist layer, e.g., the photoresist layer is composed of a positive photoresist material. In a specific embodiment, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer to be exposed to the light source will be retained upon developing the photoresist layer, e.g., the photoresist layer is composed of a negative photoresist material. In a specific embodiment, the photoresist layer is composed of a negative photoresist material such as, but not limited to, poly-cis-isoprene and poly-vinyl-cinnamate.

In an embodiment, the low-k dielectric layer 204 has a permittivity less than that of silicon dioxide, e.g., less than approximately 3.9. In one embodiment, the low-k dielectric layer 204 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, as provided above, the low-k dielectric layer 204 is a Black Diamond (BD) III film having a k value of approximately 2.55. In another embodiment, the low-k dielectric layer 204 is a porous SiCOH layer having a dielectric constant of less than 2.7.

The underlying substrate 206 may be composed of a material suitable to withstand a fabrication process and upon which semiconductor processing layers may suitably reside. In accordance with an embodiment of the present invention, substrate 206 is composed of a group IV-based material such as, but not limited to, crystalline silicon, germanium or silicon/germanium. In a specific embodiment, providing substrate 206 includes providing a monocrystalline silicon substrate. In a particular embodiment, the monocrystalline silicon substrate is doped with impurity atoms. In another embodiment, substrate 206 is composed of a III-V material. In an embodiment, a plurality of semiconductor devices resides on substrate 206, below low-k dielectric layer 204.

Referring to FIG. 2B, an offset pattern 260 is formed into, inter alia, the low-k dielectric layer 204. The offset pattern refers to misalignment with the openings 250 in the metal hard mask layer 202. The offset pattern 260 depicted can represent an offset tolerance with the fabrication of commercial wafers. Or, in another case, the offset may be intentionally formed fro the sake of optimizing a SAV etch with TiN hard mask selectivity. For example, in a specific embodiment, a greater than 30 nm offset was generated by misaligning a first via (V1) lithography prior to plasma etch, as shown in FIG. 2B.

Referring to FIG. 2C, the offset pattern 260 of FIG. 2B is etched at least partially into the low-k dielectric layer 204 to form upper trenches 270. Additionally, any layers over the TiN hardmask layer 202 are removed, e.g., by an etch or ash process.

Referring to FIG. 2D, the pattern of the TiN hardmask layer 202 is etched at least partially into the low-k dielectric layer 204 to form modified (e.g., larger) upper trenches 272. Additionally, the etch extends the offset pattern 260 to the bottom of the low-k dielectric layer 204 and, possibly, through etch stop layer 218, to form lower trenches 274. The lower trenches 274 are effectively via trenches 274 which are self-aligned with the metal line upper trenches 272. Thus, upon metal fill of the trenches 272 and 274, a plurality of self-aligned vias can be formed. More specifically, the process shown in FIG. 2C may be referred to as a self-aligned via (SAV) and subsequent ash portion of the process flow, while the process shown in FIG. 2D may be referred to as a trench main etch (TME) portion of the process flow.

The above processing can, in an embodiment, be performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ Advant-Edge G3 etcher or in an Applied Materials™ C3 dielectric chamber, also available from Applied Materials of Sunnyvale, Calif., USA. In a specific embodiment, all the processes of FIGS. 2A-2D are performed in a single pass of an etch chamber.

In a particular embodiment, FIGS. 2A-2D illustrate a general dual damascene (DD) process sequence prior to metallization. After photoresist and OPL layer open, the clear offset pattern was shown in FIG. 2B. A series of experiments were performed to change the four important controllable parameters of the process conditions: hydrogen ($H_2$) flow rate, argon (Ar) flow rate, RF power, chamber pressure, and E-chuck temperature. These were manipulated by changing one parameter while keep the other parameters constant. The $H_2$ flow rate was varied from 0 to 300 SCCM and the Ar flow rate was varied from 0 to 1200 SCCM. The E-check temperature was changed from 60° C. to 20° C. The size, structure and profile of the vias were examined using Hitachi 4800 scanning electron microscopy (SEM). By way of demonstration, a series of scanning electron microscope (SEM) images is used to depict the process flow, or development thereof, shown in FIGS. 2A-2D. For example, FIG. 2E is a scanning electron microscope (SEM) image 200E of an incoming material stack similar to that of material stack 200 described in association with FIG. 2A, in accordance with an embodiment of the present invention.

Figure 3:
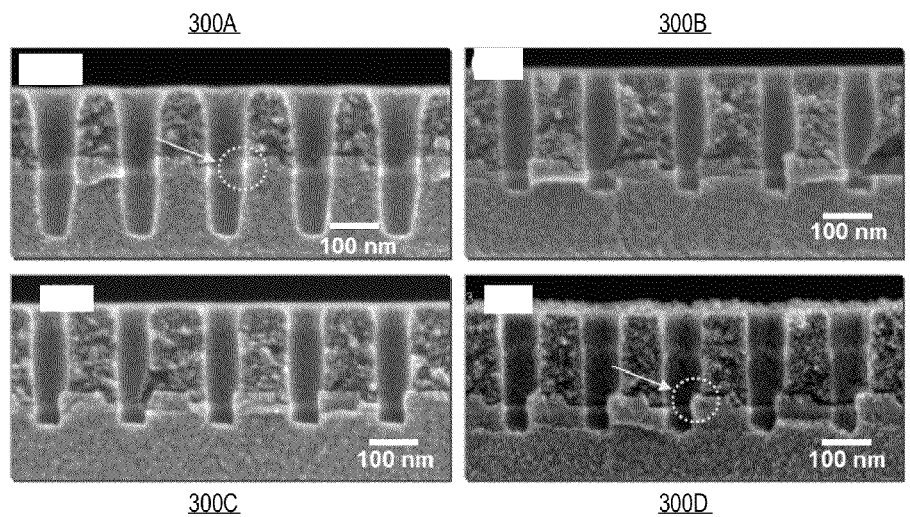
FIG. 3 is a series of SEM images 300A, 300B, 300C and 300D showing vias at different hydrogen gas flow rates, in accordance with an embodiment of the present invention.

FIG. 3 is a series of SEM images 300A, 300B, 300C and 300D showing vias at different hydrogen gas flow rates, in accordance with an embodiment of the present invention. Specifically, SEM image 300A is a control sample, to which a non-SAV process was performed. The arrow in 300A reveals TiN erosion completely. However, referring to images 300B-300D, increasing hydrogen gas inclusion in an SAV etch of a low-k dielectric film is represented. As can be seen, TiN selectivity increases with increasing $H_2$ flow rate. More specifically, for 300A the reference sample uses 0 SCCM of $H_2$; for 300B selectivity is improved at 150 SCCM $H_2$; for 300C, selectivity is significantly improved at 200 SCCM $H_2$; and for 300D the best selectivity is observed at 300 SCCM $H_2$.

Figure 4:
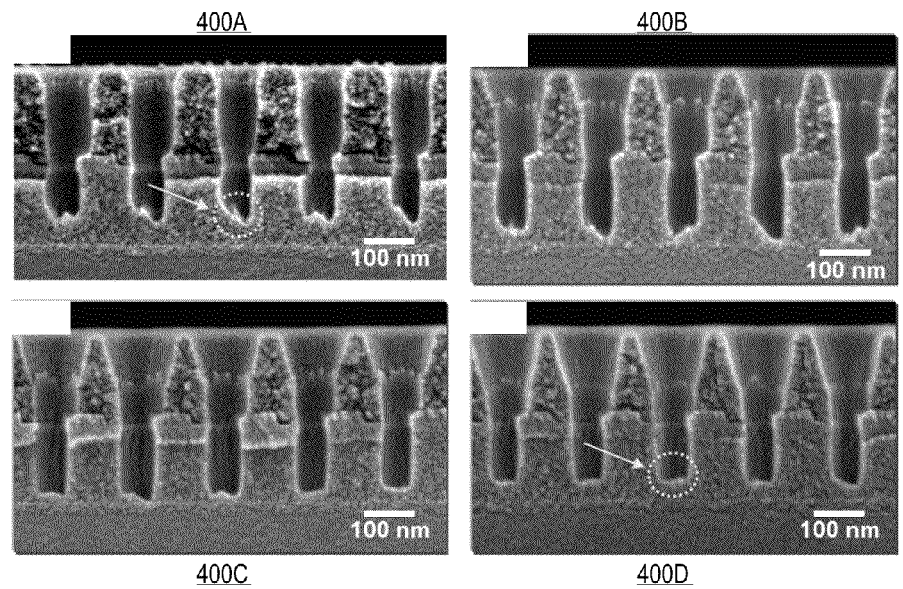
FIG. 4 is a series of SEM images 400A, 400B, 400C and 400D showing vias at different argon gas flow rates, but at the same hydrogen flow rates, in accordance with an embodiment of the present invention.

However, upon etching into the material stack with higher hydrogen gas flow, etch front problems can be observed. These can be mitigated by the inclusion of Ar gas. For example, FIG. 4 is a series of SEM images 400A, 400B, 400C and 400D showing vias at different argon gas flow rates, but at the same hydrogen flow rates, in accordance with an embodiment of the present invention. Referring to 400A, 0 SCCM Ar is used, and the worst etch front was observed. Referring to images 400B-400D, increasing argon gas inclusion in an SAV etch of a low-k dielectric film is represented. More specifically, for 400B etch front issues begin to be mitigated at 300 SCCM Ar; for 400C, etch front issues are significantly mitigated at 600 SCCM Ar; and for 400D least etch front issues are observed at 1200 SCCM Ar.

Figure 5:
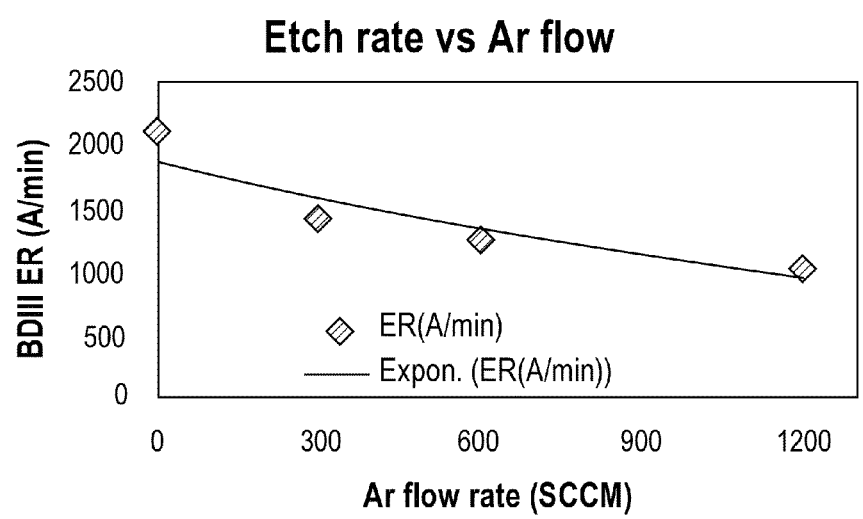
FIG. 5 is a plot of low k film etch rate as a function of Ar flow rate, in accordance with an embodiment of the present invention.

In one embodiment, increasing Ar dilutes the reactant flow of the $CF_4$ portion of the etchant. FIG. 5 is a plot 500 of low k film (BD III) etch rate (in Angstroms per minute) as a function of Ar flow rate (in SCCM), in accordance with an embodiment of the present invention. Referring to plot 500, an increasing amount of Ar included in an etch gas mixture for a SAV process flow can dilutes the reactant flow of the $CF_4$ portion of the etchant, providing a more controlled etching process. Specifically, via etch rate (ER) decreases almost 50% by increasing Ar flow rate from 0 to 1200 SCCM.

Figure 6:
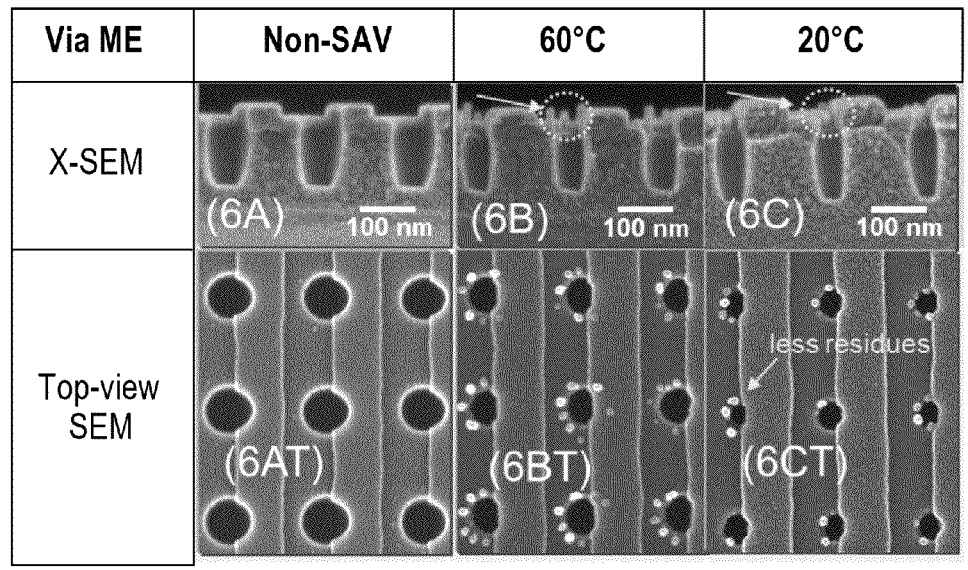
FIG. 6 includes a cross-sectional series 6A-6C of SEM images and corresponding top-down series 6AT-6CT of SEM images for a variety of processing operations in an SAV process flow, in accordance with an embodiment of the present invention.

In another aspect, considerations for SAV processing can also include titanium oxide (TiOx) residues resulting from etching a titanium nitride hardmask. For example, in one embodiment, such residues may form during the via etch operation described above in association with FIG. 2D. For example, FIG. 6 includes a cross-sectional series 6A-6C of SEM images and corresponding top-down series 6AT-6CT of SEM images for a variety of processing operations, in accordance with an embodiment of the present invention. Referring to SEM images 6A and 6AT, a reference sample has a larger via critical dimension (CD) due to non-SAV processing, e.g., representing via-to-line short at non-SAV processing. In an embodiment, TiOx residues are reduced by decreasing the wafer temperature (e.g., by reducing the electrostatic chuck (ESC) temperature). For example, referring to SEM images 6C and 6CT, the SAV process performed at 20 degrees Celsius shows less TiOx residue than the SAV process performed at 60 degrees Celsius (the latter depicted in SEM images 6B and 6BT). In one embodiment, the lower temperature processing minimizes Ti sputtering. Less Ti by-product sputtered at a lower ESC temperature results in less residue. In another embodiment, TiOx residues are reduced by raising RF power of a corresponding ash operation.

Figure 7:
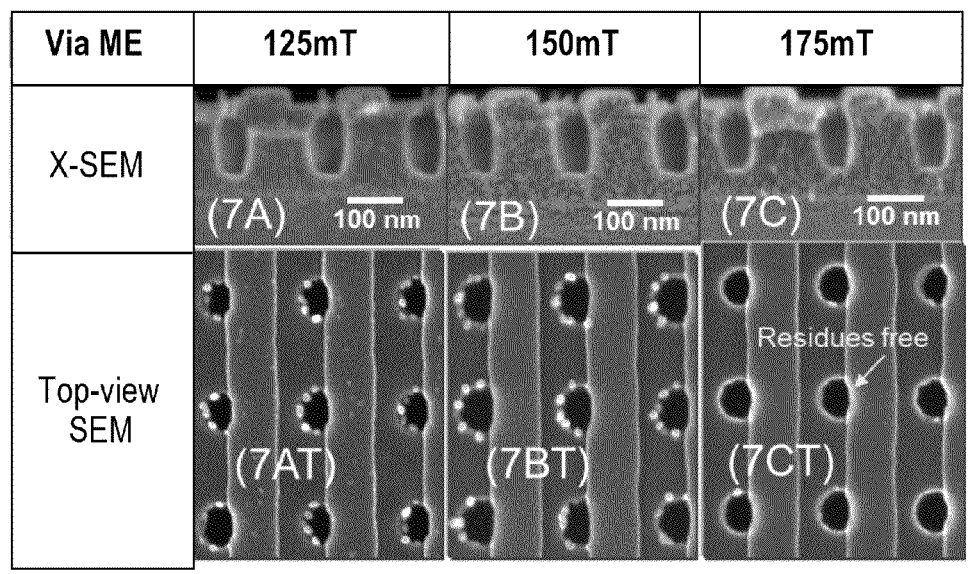
FIG. 7 includes a cross-sectional series 7A-7C of SEM images and corresponding top-down series 7AT-7CT of SEM images for a variety of processing operations, in accordance with an embodiment of the present invention.

In another aspect, considerations for SAV processing can also include reducing TiOx residues by raising pressure of the SAV etch process. FIG. 7 includes a cross-sectional series 7A-7C of SEM images and corresponding top-down series 7AT-7CT of SEM images for a variety of processing operations, in accordance with an embodiment of the present invention. Referring to SEM images 7A and 7AT through 7C and 7CT, a residues-free SAV was achieved at higher pressure (e.g., 175 mTorr improved over 150 mTorr, which is improved over 125 mTorr). Thus, such residues are suppressed by higher pressure. In one embodiment, the mechanism to minimize TiOx residues is to minimize the TiOx sputtering on the side wall of via which is enabled by an increased pressure.

Figure 8:
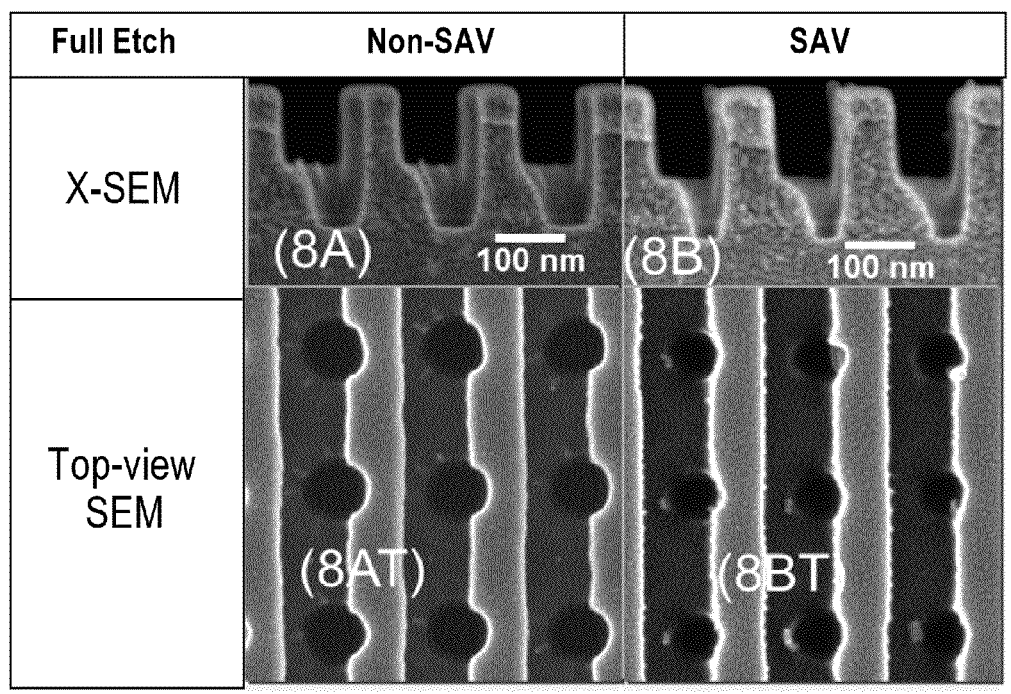
FIG. 8 includes a cross-sectional series 8A-8B of SEM images and corresponding top-down series 8AT-8BT of SEM images for a full etch comparison of a non-SAV and an SAV process flow, in accordance with an embodiment of the present invention.

FIG. 8 includes a cross-sectional series 8A-8B of SEM images and corresponding top-down series 8AT-8BT of SEM images for a full etch comparison of a non-SAV and an SAV process flow, in accordance with an embodiment of the present invention. Referring to FIG. 8, demonstrated TiN encroachment improvement is seen with the above described SAV process. In one such embodiment, a self-aligned-via etch process can be implemented successfully for a 45 nanometer critical dimension (CD45) dual damascene (DD) structure. In a specific embodiment, $H_2$ flow rate strongly impacts the TiN selectivity. In another specific embodiment, increasing Ar flow rate can be used to solve etch front issues. In yet another specific embodiment, minimizing Ti sputtering is shown to be an important factor to avoid TiOx residues.

In another aspect, in accordance with an embodiment of the present invention, the dry etch development of a metal nitride titanium (e.g., titanium nitride, TiN) hardmask is described. To provide context, in the semiconductor industry, the traditional method for metal hardmask removal is a wet etch. As process dimensions continue to shrink, dielectric pattern collapse during etch becomes a critical issue due to scaling. While the scale is less than 64 nm pitches, pattern collapse often occurs during drying in the wet etch because of the capillary forces between structures. Thus, metal hardmask removal becomes very critical in success of high performance semiconductor device fabrication.

More specifically, one or more embodiments is directed to a dry etch of a metal hardmask (HM) instead of using a conventional wet etch for HM removal. For example, when a dielectric pattern is etched by carbon free chemistry, such as silicon flouride process gases ($SiF_4$, $Si_xF_y$), the sidewall of low k films and Cu surfaces are protected by the Si-based byproducts formed during etching. The TiN hardmask can be etched away without low k damage. In one embodiment, a down stream siconi process is then applied to remove sidewall passivation.

In an embodiment, when a dielectric pattern is etched with conventional fluorocarbon-based chemistry, the process is more complicated. In order to protect low k material and Cu, a sidewall passivation with $SiF_x$ is required. Once the $SiO_x$ passivation layer is formed, the metal layer can be etched away and a down stream siconi process is then applied to remove sidewall passivation, as mentioned above and described below in greater detail. In order to obtain better low k and Cu surface protection, an optional operation includes deposition of polymer into a patterned structure and subsequent etch back of the polymer until a cap oxide layer, after a $SiO_x$ passivation layer is formed. A TiN removal process selective to oxide film is then applied, followed by, in one embodiment, an ashing operation to remove all polymers. The final operation is, in a particular embodiment, the removal of the passivation layer with a siconi process.

Figure 9:
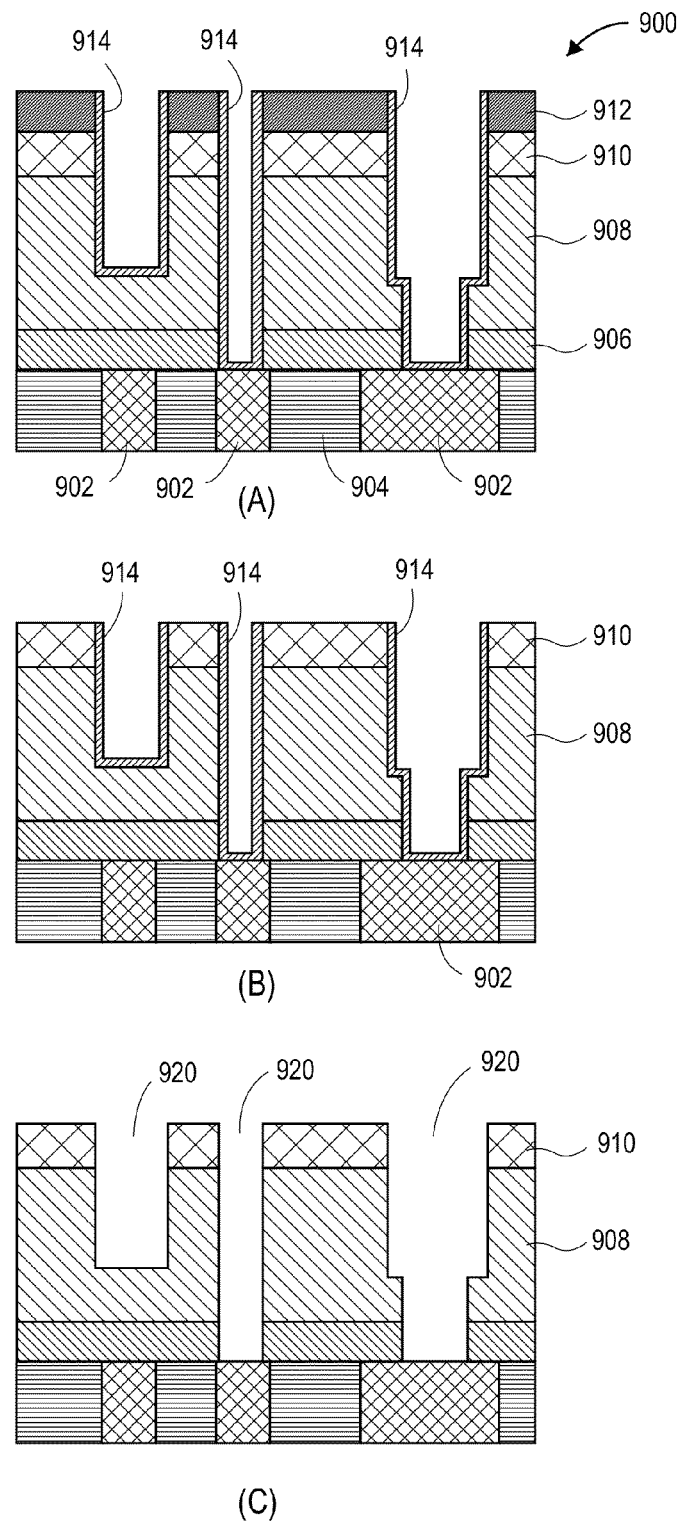
FIG. 9 illustrates various cross-sectional views of an apparatus subjected to a first metal hardmask removal process, in accordance with an embodiment of the present invention.

In a first example, FIG. 9 illustrates various cross-sectional views of an apparatus subjected to a first metal hardmask removal process, in accordance with an embodiment of the present invention.

Referring to FIG. 9, a material stack 900 for etching includes a lower interconnect layer 902, e.g., a copper layer, includes patterned metal features disposed in a lower dielectric layer 904. An etch stop layer 906 is disposed over the interconnect layer 902 and the lower dielectric layer 904. An upper dielectric layer 908, such as a low-k dielectric layer, is disposed on the etch stop layer 906. A mask includes an oxide layer 910, such as a silicon dioxide layer, and a metal nitride hardmask layer 912, such as a titanium nitride hardmask layer. It is to be understood that the specific film stack shown is one of many suitable arrangements for low-k etch processing described herein.

Referring to part (A) of FIG. 9, a method of patterning a low-k dielectric film includes forming a pattern in the metal nitride hardmask layer 912. The pattern is at least partially etched into the low-k dielectric layer 908 using the metal nitride hardmask layer 912 as a mask, in some instances exposing portions of interconnect layer 902. In an embodiment, the etching involving using a plasma etch based on $SiF_x$. The etching also involves forming an $SiO_x$ passivation layer 914 at least on sidewalls of the low-k dielectric layer 908 formed during the etching.

Referring next to part (B) of FIG. 9, the metal nitride hardmask layer 912 is removed by a dry etch process. In an embodiment, the $SiO_x$ passivation layer 914 protects the low-k dielectric layer 908 during the removing of the metal nitride hardmask layer 912. Additionally, in one embodiment, the oxide layer 910 of the mask protects top portions of the low-k dielectric layer 908 during the removing of the metal nitride hardmask layer 912. In a specific embodiment, as depicted, the $SiO_x$ passivation layer 914 further protects exposed copper surfaces during the metal nitride hardmask layer removal.

Referring next to part (C) of FIG. 9, the method further includes, subsequent to the removing the metal nitride hardmask layer 912 by the dry etch process, removing the $SiO_x$ passivation layer 914, exposing patterned portion of the low-k dielectric layer 908. In one embodiment, removing the $SiO_x$ passivation layer 914 involves using a siconi process. Although not depicted, the resulting trenches 920 can then be filled with a conductive material, such as copper, in order to form interconnects. The trenches can be filled prior to or subsequent to removal of the oxide layer 910. In an embodiment, subsequent to the removing the metal nitride hardmask layer by the dry etch process and prior to removing the $SiO_x$ passivation layer, an ashing process is performed. In one such embodiment, the $SiO_x$ passivation layer protects the low-k dielectric film during the ashing.

Referring again to FIG. 9, in a specific embodiment, a process flow for a titanium nitride (TiN) hardmask (HM) is provided. Requirements of such a process may include one or more of protection of low-k films and exposed copper (Cu) surfaces from damage, and complete removal of a sidewall passivation layer. In one embodiment, the approach for removal involves etch process development with carbon-free chemistry using $SiF_x$ (e.g., providing sidewall protection to prevent low-k damage and Cu surface protection during TiN HM etch). The sidewall passivation is then removed with a Siconi type process.

Figure 10A:
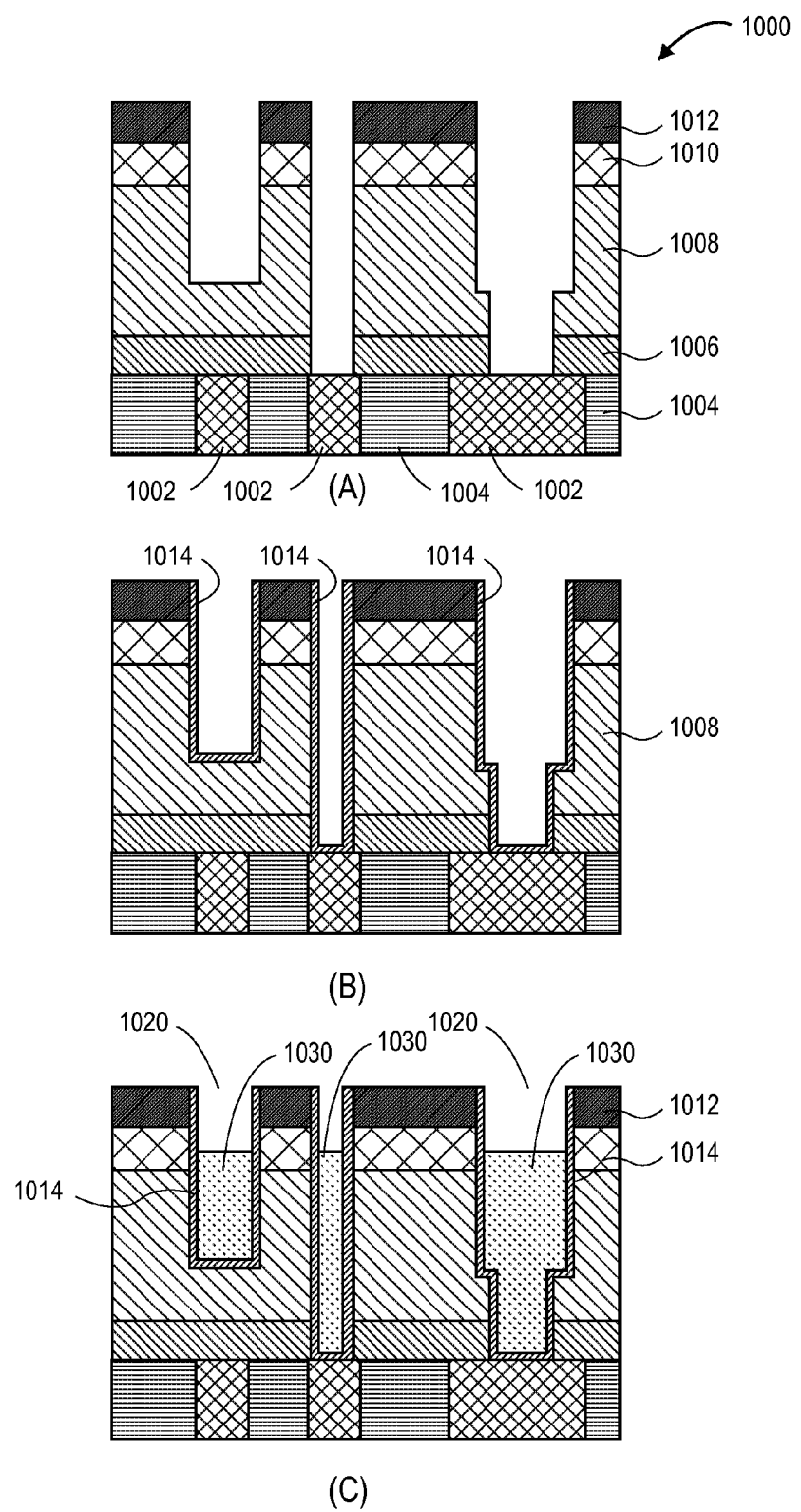
FIGS. 10A and 10B illustrate various cross-sectional views of an apparatus subjected to a second metal hardmask removal process, in accordance with another embodiment of the present invention.
Figure 10B:
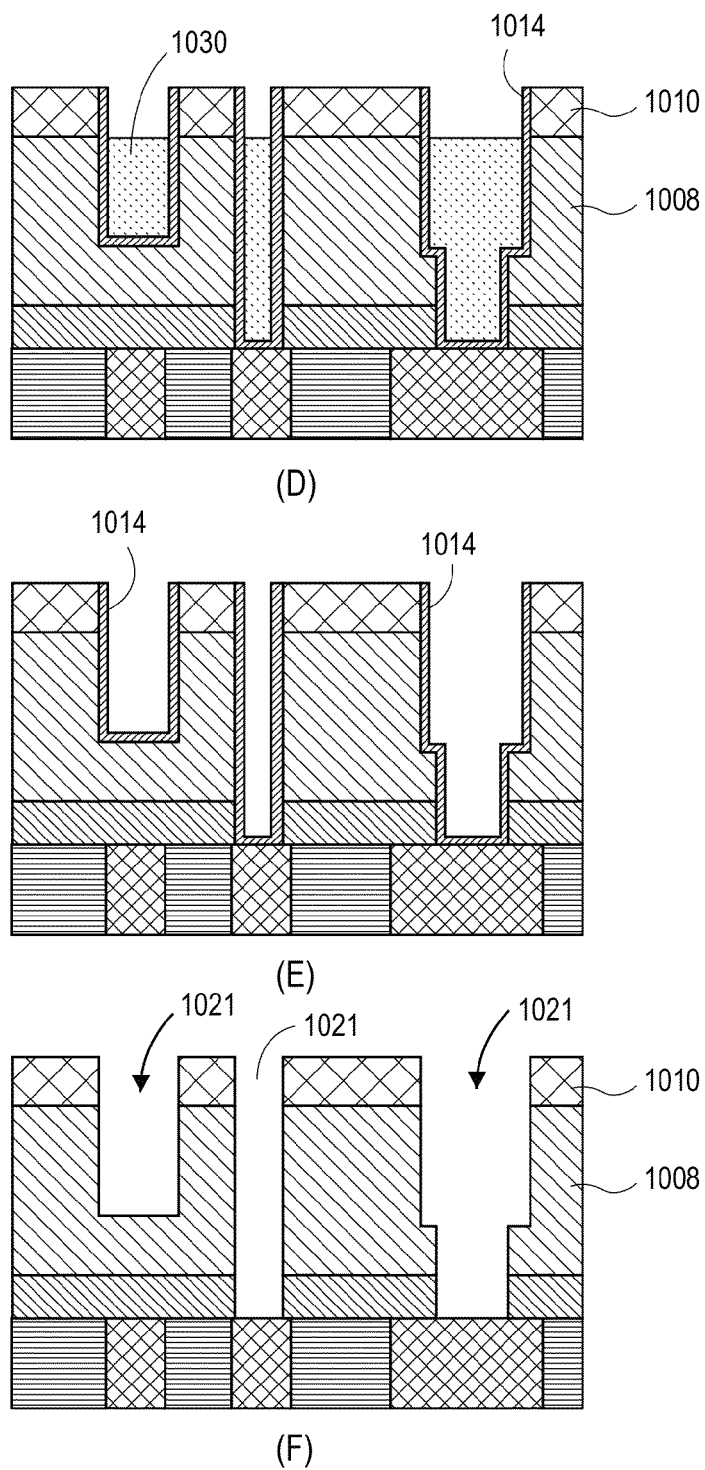

In a second example, FIGS. 10A and 10B illustrate various cross-sectional views of an apparatus subjected to a second metal hardmask removal process, in accordance with another embodiment of the present invention.

Referring to part (A) of FIG. 10A, a material stack 1000 for etching includes a lower interconnect layer 1002, e.g., a copper layer, includes patterned metal features disposed in a lower dielectric layer 1004. An etch stop layer 1006 is disposed over the interconnect layer 1002 and the lower dielectric layer 1004. An upper dielectric layer 1008, such as a low-k dielectric layer, is disposed on the etch stop layer 1006. A mask includes an oxide layer 1010, such as a silicon dioxide layer, and a metal nitride hardmask layer 1012, such as a titanium nitride hardmask layer. It is to be understood that the specific film stack shown is one of many suitable arrangements for low-k etch processing described herein. Referring again to part (A) of FIG. 10A, a method of patterning a low-k dielectric film includes forming a pattern in the metal nitride hardmask layer 1012. The pattern is at least partially etched into the low-k dielectric layer 1008 using the metal nitride hardmask layer 1012 as a mask, in some instances exposing portions of interconnect layer 1002. In one embodiment, the etching involves using a first plasma etch free of $SiF_x$.

Referring next to part (B) of FIG. 10A, an $SiO_x$ passivation layer 1014 is subsequently formed at least on sidewalls of the low-k dielectric layer 1008 by a second plasma process based on $SiF_x$.

Referring next to part (C) of FIG. 10A, subsequent to forming the $SiO_x$ passivation layer 1014 a polymer layer 1030 is formed and etched back (e.g., recessed) within the trenches 1020 of the pattern and adjacent to at least a portion of the $SiO_x$ passivation layer 1014.

Referring next to part (D) of FIG. 10B, the metal nitride hardmask layer 1012 is removed by a dry etch process. In an embodiment, the $SiO_x$ passivation layer 1014 protects the low-k dielectric layer 1008 during the removing of the metal nitride hardmask layer 1012. In a specific embodiment, the low-k dielectric layer 1008 is further protected by the polymer layer 1030. Additionally, in one embodiment, the oxide layer 1010 of the mask protects top portions of the low-k dielectric layer 1008 during the removing of the metal nitride hardmask layer 1012. In a specific embodiment, as depicted, the $SiO_x$ passivation layer 1014 and the polymer layer 1030 further protect exposed copper surfaces during the metal nitride hardmask layer 1012 removal.

Referring to part (E) of FIG. 10B, in an embodiment, subsequent to the removing the metal nitride hardmask layer by the dry etch process and prior to removing the $SiO_x$ passivation layer 1014, an ashing process is performed. In one such embodiment, the $SiO_x$ passivation layer protects the low-k dielectric film during the ashing. In one embodiment, as depicted, the polymer layer 1030 is removed during the ashing process.

Referring next to part (F) of FIG. 10B, the method further includes, subsequent to the removing the metal nitride hardmask layer 1012 by the dry etch process, removing the $SiO_x$ passivation layer 1014, exposing patterned portion of the low-k dielectric layer 1008. In one embodiment, removing the $SiO_x$ passivation layer 1014 involves using a siconi process. Although not depicted, the resulting trenches 1021 can then be filled with a conductive material, such as copper, in order to form interconnects. The trenches can be filled prior to or subsequent to removal of the oxide layer 1010.

Referring again to FIGS. 10A and 10B, in a specific embodiment, a process flow for a titanium nitride (TiN) hardmask (HM) is provided. In one embodiment, the approach for removal involves using an etch with conventional chemistry. The approach protects an exposed Cu surface with polymer deposition. Exposed low-k sidewalls are protected during ashing by an $Si_{Ox}$ passivation layer. The sidewall passivation is then removed with a Siconi type process.

Thus, in an embodiment, the removal of an Si—O-containing layer may be performed using a plasma process based on a plasma generated from a gas such as, but not limited to, $NF_3$, ammonia ($NH_3$), or a combination thereof. For example, in a specific such embodiment, a "Siconi" dry etch is used and involves (a) etchant generation in the plasma according to $NF_3 + NH_3 \rightarrow NH_4F + NH_4F.HF$, (b) etch process at approximately 30 degrees Celsius according to $NH_4F$ or $NH_4F.HF + SiO_2 \rightarrow (NH_4)_2SiF_6(solid) + H_2O$, and (c) sublimation above approximately 100 degrees Celsius according to $(NH_4)_2SiF_6 (solid) \rightarrow SiF_4(gas) + (NH_3)(gas) + HF(gas)$ which is ultimately used to etch the Si—O-containing modification layer. In an alternative embodiment, however, removing the Si—O-containing modification layer includes exposing film to a vapor such as, but not limited to, hydrogen fluoride (HF) vapor or $NF_4.HF$ vapor.

In an embodiment, a siconi chamber is used for etchant generation in a remote plasma cavity and silicon oxide reaction, with a wafer or substrate situated on the cold pedestal. The wafer is raised toward the showerhead and sublimation of by-products is effected by the hot showerhead. Upon removal of the by-products, the wafer or substrate is cleaned. The clean wafer or substrate is then lowered for removal. Thus, in one embodiment, a dry clean process, as carried out at least partially in the siconi chamber, is used to remove a modified portion of a titanium nitride film selective to a low-k film and/or other surrounding layers.

A method of removing a metal hardmask in the presence of an ultra low-k dielectric film may be conducted in processing equipment suitable to provide an etch plasma in proximity to a sample for etching. For example, FIG. 11 illustrates a system in which a metal hardmask removal process is performed, in accordance with an embodiment of the present invention.

Figure 11:
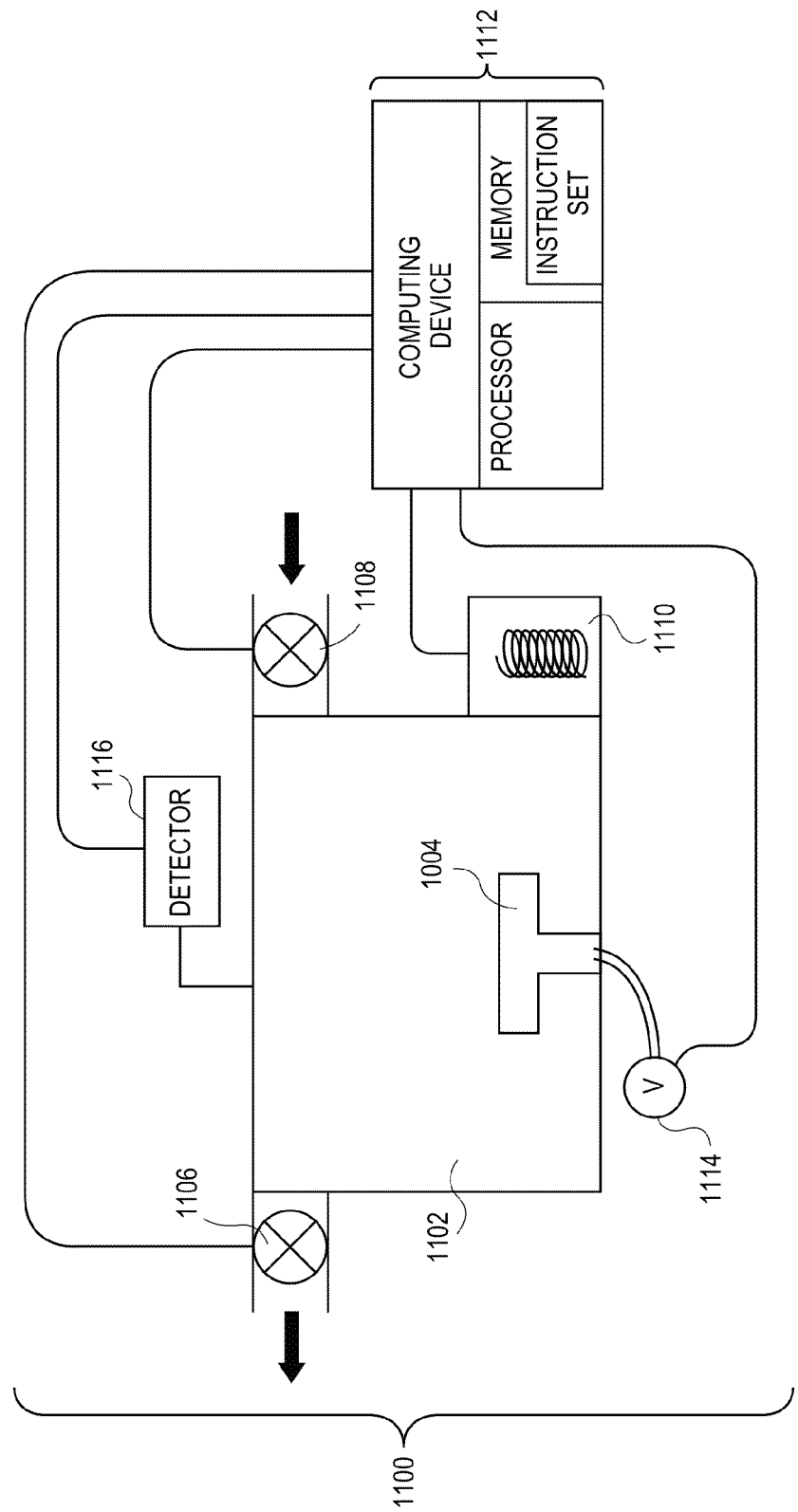
FIG. 11 illustrates a system in which a metal hardmask removal process is performed, in accordance with an embodiment of the present invention.

Referring to FIG. 11, a system 1100 for conducting a plasma etch process includes a chamber 1102 equipped with a sample holder 1104. An evacuation device 1106, a gas inlet device 1108 and a plasma ignition device 1110 are coupled with chamber 1102. A computing device 1112 is coupled with plasma ignition device 1110. System 1100 may additionally include a voltage source 1114 coupled with sample holder 1104 and a detector 1116 coupled with chamber 1102. Computing device 1112 may also be coupled with evacuation device 1106, gas inlet device 1108, voltage source 1114 and detector 1116, as depicted in FIG. 11.

Chamber 1102 and sample holder 1104 may include a reaction chamber and sample positioning device suitable to contain an ionized gas, i.e. a plasma, and bring a sample in proximity to the ionized gas or charged species ejected therefrom. Evacuation device 1106 may be a device suitable to evacuate and de-pressurize chamber 1102. Gas inlet device 1108 may be a device suitable to inject a reaction gas into chamber 1102. Plasma ignition device 1110 may be a device suitable for igniting a plasma derived from the reaction gas injected into chamber 1102 by gas inlet device 1108. Detection device 1116 may be a device suitable to detect an endpoint of a processing operation. In one embodiment, system 1100 includes a chamber 1102, a sample holder 1104, an evacuation device 1106, a gas inlet device 1108, a plasma ignition device 1110 and a detector 1116 similar to, or the same as, those included in an Applied Centura® Enabler dielectric etch system, an Applied Materials™ AdvantEdge G3 system, or an Applied Materials™ C3 dielectric etch chamber.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
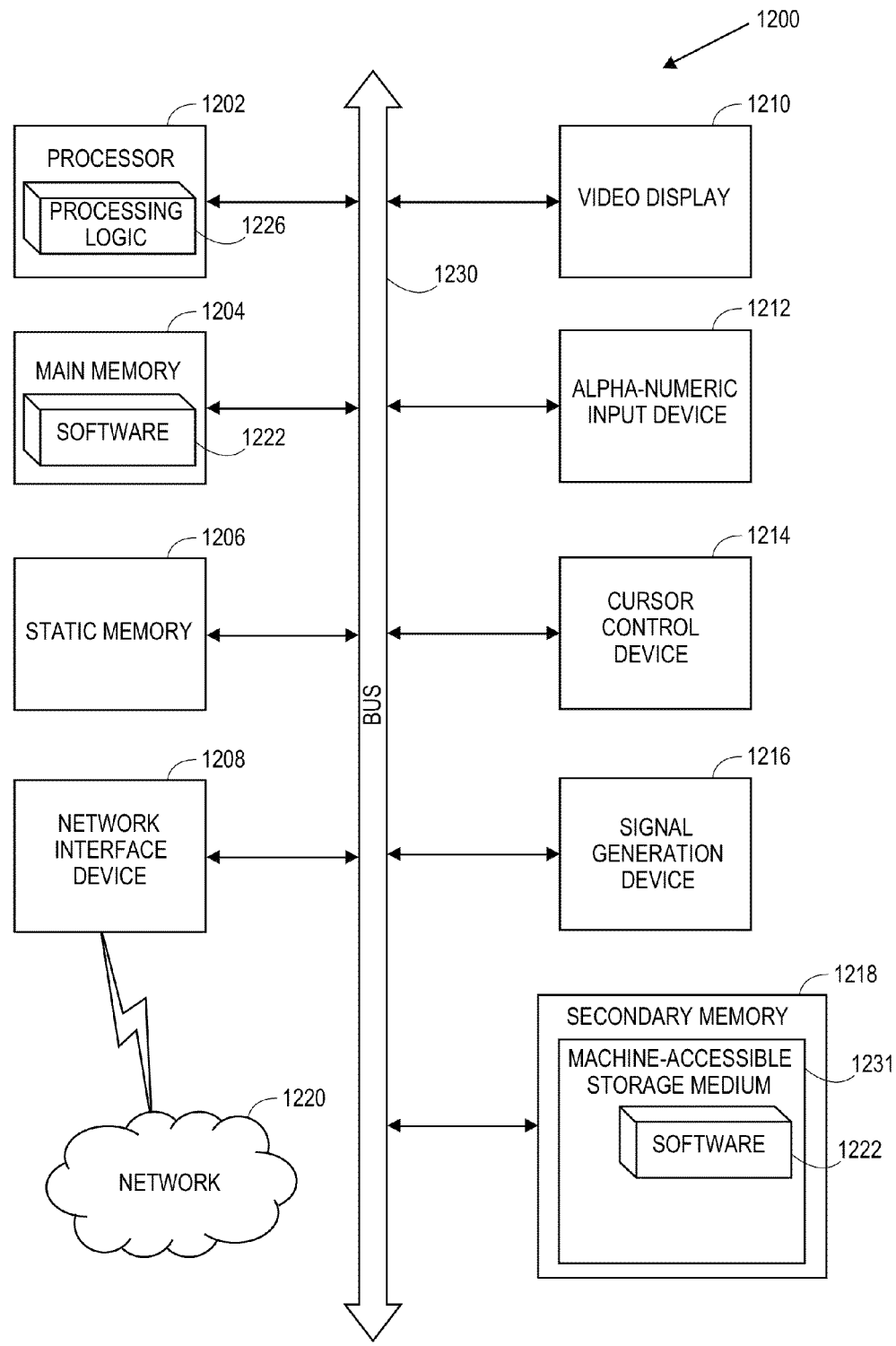
FIG. 12 illustrates a block diagram of an exemplary computer system, in accordance with an embodiment of the present invention.

FIG. 12 illustrates a diagrammatic representation of a machine in the exemplary form of a computer system 1200 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 1200 is suitable for use as computing device 1112 described in association with FIG. 11.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations discussed herein.

The computer system 1200 may further include a network interface device 1208. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1231 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1231 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of removing metal hardmasks in the presence of ultra low-k dielectric films have been disclosed.

What is claimed is:

1. A method of patterning a low-k dielectric film, the method comprising:
   forming a pattern in a metal nitride hardmask layer formed above a low-k dielectric film formed above a substrate;
   etching, using the metal nitride hardmask layer as a mask, the pattern at least partially into the low-k dielectric film, the etching comprising using a plasma etch based on $SiF_x$, wherein the etching comprises forming an $SiO_x$ passivation layer at least on sidewalls of the low-k dielectric film formed during the etching; and
   removing the metal nitride hardmask layer by a dry etch process, wherein the $SiO_x$ passivation layer protects the low-k dielectric film during the removing.

2. The method of claim 1, further comprising:
   subsequent to the removing the metal nitride hardmask layer by the dry etch process, removing the $SiO_x$ passivation layer.

3. The method of claim 2, further comprising:
   subsequent to the removing the metal nitride hardmask layer by the dry etch process and prior to removing the $SiO_x$ passivation layer, performing an ashing process, wherein the $SiO_x$ passivation layer protects the low-k dielectric film during the ashing.

4. The method of claim 1, wherein the $SiO_x$ passivation layer further protects exposed copper surfaces during the removing, the exposed copper surfaces formed from copper regions disposed below the low-k dielectric film exposed during the etching.

5. The method of claim 1, wherein the metal nitride hardmask layer is a titanium nitride hardmask layer.

6. The method of claim 1, wherein removing the metal nitride hardmask layer by the dry etch process is performed with selectively to an oxide layer disposed between the metal nitride hardmask layer and the low-k dielectric film.

7. The method of claim 1, wherein the plasma etch based on $SiF_x$ is a carbon-free plasma etch.

8. The method of claim 1, wherein the low-k dielectric film comprises a material selected from the group consisting of a fluorine-doped silicon dioxide, a carbon-doped silicon dioxide, a porous silicon dioxide, a porous carbon-doped silicon dioxide, a spin-on silicone based polymeric dielectric, and a spin-on organic polymeric dielectric.

9. A method of patterning a low-k dielectric film, the method comprising:
   forming a pattern in a metal nitride hardmask layer formed above a low-k dielectric film formed above a substrate;
   etching, using the metal nitride hardmask layer as a mask, the pattern at least partially into the low-k dielectric film, the etching comprising using a first plasma etch free of $SiF_x$; and, subsequently,
   forming, using a second plasma etch based on $SiF_x$, an $SiO_x$ passivation layer at least on sidewalls of the low-k dielectric film formed during the etching; and
   removing the metal nitride hardmask layer by a dry etch process, wherein the $SiO_x$ passivation layer protects the low-k dielectric film during the removing.

10. The method of claim 9, further comprising:
    subsequent to the removing the metal nitride hardmask layer by the dry etch process, removing the $SiO_x$ passivation layer.

11. The method of claim 10, further comprising:
    subsequent to the removing the metal nitride hardmask layer by the dry etch process and prior to removing the $SiO_x$ passivation layer, performing an ashing process, wherein the $SiO_x$ passivation layer protects the low-k dielectric film during the ashing.

12. The method of claim 9, wherein the $SiO_x$ passivation layer further protects exposed copper surfaces during the removing, the exposed copper surfaces formed from copper regions disposed below the low-k dielectric film exposed during the etching.

13. The method of claim 9, wherein the metal nitride hardmask layer is a titanium nitride hardmask layer.

14. The method of claim 9, wherein removing the metal nitride hardmask layer by the dry etch process is performed with selectively to an oxide layer disposed between the metal nitride hardmask layer and the low-k dielectric film.

15. The method of claim 14, wherein the oxide layer protects the low-k dielectric film during the removing of the metal nitride hardmask layer by the dry etch process.

16. The method of claim 9, further comprising:
    subsequent to forming the $SiO_x$ passivation layer and prior to removing the metal nitride hardmask layer, forming and etching back a polymer layer within the pattern and adjacent to at least a portion of the $SiO_x$ passivation layer.

17. The method of claim 9, wherein the second plasma etch based on $SiF_x$ is a carbon-free plasma etch.

18. The method of claim 9, wherein the low-k dielectric film comprises a material selected from the group consisting of a fluorine-doped silicon dioxide, a carbon-doped silicon dioxide, a pourous silicon dioxide, a porous carbon-doped silicon dioxide, a spin-on silicone based polymeric dielectric, and a spin-on organic polymeric dielectric.

\* \* \* \* \*